(12) United States Patent
Ding et al.

(10) Patent No.: US 10,574,247 B1
(45) Date of Patent: Feb. 25, 2020

(54) DIGITAL-TO-ANALOG CONVERTER TRANSFER FUNCTION MODIFICATION

(71) Applicant: Analog Devices Global Unlimited Company, Hamilton (BM)

(72) Inventors: Junbiao Ding, Beijing (CN); Tony Yincai Liu, Beijing (CN); Dennis A. Dempsey, Newport (IE); John Jude O'Donnell, Quin (IE)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/131,886

(22) Filed: Sep. 14, 2018

(51) Int. Cl.
| H03M 1/36 | (2006.01) |
| H03M 1/06 | (2006.01) |
| H03M 1/14 | (2006.01) |
| H03H 7/40 | (2006.01) |
| H03H 11/30 | (2006.01) |

(52) U.S. Cl.
CPC ............ *H03M 1/0604* (2013.01); *H03H 7/40* (2013.01); *H03H 11/30* (2013.01); *H03M 1/145* (2013.01); *H03M 1/365* (2013.01)

(58) Field of Classification Search
CPC .... H03M 1/0604; H03M 1/145; H03M 1/365; H03H 7/40
USPC .................. 341/134, 141, 144, 159, 118, 120
See application file for complete search history.

(56) References Cited

U.S. PATENT DOCUMENTS

| 3,539,831 A | 11/1970 | Gilbert |
| 4,338,591 A | 7/1982 | Tuthill |
| 4,491,825 A | 1/1985 | Tuthill |
| 4,543,560 A | 9/1985 | Holloway |
| 4,558,242 A | 12/1985 | Tuthill et al. |
| 5,396,245 A | 3/1995 | Rempfer |
| 5,432,478 A | 7/1995 | Gilbert et al. |
| 5,684,431 A | 11/1997 | Gilbert et al. |
| 5,703,588 A | 12/1997 | Rivoir et al. |
| 5,859,606 A | 1/1999 | Schrader et al. |
| 5,969,657 A | 10/1999 | Dempsey et al. |
| 6,204,785 B1 | 3/2001 | Fattaruso et al. |
| 6,246,351 B1 | 6/2001 | Yilmaz |

(Continued)

OTHER PUBLICATIONS

"Chapter 3: Data Converter Architectures", ADI Data Conversion Handbook, [Online] Retrieved from the internet Mar. 18, 2019: <URL: https://www.analog.com/media/en/training-seminars/design-handbooks/Data-Conversion-Handbook/Chapter3.pdf>, (2005), 142 pgs.

(Continued)

*Primary Examiner* — Peguy Jean Pierre
(74) *Attorney, Agent, or Firm* — Schwegman Lundberg & Woessner, P.A.

(57) ABSTRACT

The present disclosure relates to a digital-to-analog converter (DAC) which includes a resistor string and a transfer function modification circuit. The transfer function modification circuit may be a calibration circuit for calibrating the DAC, The calibration circuit may include a plurality of current sources, which may be current DACs. Each of the current DACS inject current into, or drain current from, a respective node of the resistor string, in order to correct for voltage errors. The injected currents may be positive or negative, depending on the voltage error. The current DACs are controlled by trim codes, which are set dependent on the measured or simulated voltage errors for a given resistor string.

23 Claims, 11 Drawing Sheets

(56) References Cited

U.S. PATENT DOCUMENTS

| | | |
|---|---|---|
| 6,252,534 B1 | 6/2001 | Timko |
| 6,331,830 B1 | 12/2001 | Song et al. |
| 6,433,717 B1 | 8/2002 | Leung |
| 6,448,916 B1 | 9/2002 | Leung |
| 6,448,917 B1 | 9/2002 | Leung et al. |
| 6,642,877 B2 | 11/2003 | Leung |
| 6,707,404 B1 | 3/2004 | Yilmaz |
| 6,914,547 B1 | 7/2005 | Swaroop et al. |
| 7,015,847 B1 | 3/2006 | Mclachlan et al. |
| 7,068,193 B2 | 6/2006 | Dempsey et al. |
| 7,136,002 B2 | 11/2006 | Dempsey et al. |
| 7,173,552 B1 | 2/2007 | Garcia |
| 7,339,508 B2 | 3/2008 | Cosgrave et al. |
| 7,362,177 B2 | 4/2008 | Gilbert |
| 7,417,572 B1 | 8/2008 | Williams et al. |
| 7,796,060 B2 | 9/2010 | Oberhuber et al. |
| 8,125,362 B1 * | 2/2012 | Bereza ................ H03M 3/322 341/143 |
| 9,100,045 B2 | 8/2015 | Dempsey |
| 9,124,296 B2 | 9/2015 | Dempsey |
| 9,300,318 B1 * | 3/2016 | Medina Sanchez-Castro ............ H03M 1/0863 |
| 9,325,337 B1 | 4/2016 | Dempsey |
| 9,407,278 B1 | 8/2016 | Dempsey |
| 9,444,487 B1 | 9/2016 | Dempsey |
| 9,583,241 B1 | 2/2017 | Dempsey |
| 9,941,894 B1 | 4/2018 | Gu et al. |
| 9,948,315 B2 | 4/2018 | Dempsey |
| 2006/0125669 A1 | 6/2006 | Dempsey et al. |
| 2007/0296618 A1 | 12/2007 | Cosgrave et al. |
| 2014/0002289 A1 | 1/2014 | Dempsey |
| 2018/0323798 A1 * | 11/2018 | Liu .................. H03M 1/785 |

OTHER PUBLICATIONS

Cummins, Tim, et al., "An IEEE Standard Transducer Interface Chip with 12-b ADC, Two 12-b DAC's, 10-kB Flash EEPROM, and 8-b Microcontroller", IEEE Journal of Solid-State Circuits, vol. 33, No. 12, (Dec. 1998), 9 pgs.

Kester, Walt, "Basic DAC Architectures II: Binary DACs", Analog Devices MT-015 Tutorial, [Online] Retrieved from the Internet Mar. 18, 2019: <URL: https://www.analog.com/media/en/training-seminars/tutorials/MT-015.pdf?doc=AN-1226.pdf>, (2009), 10 pgs.

Prakesh, Rahul, et al., "Trimming a digital-to-analog converter to improve accuracy", EDN Network, [Online] Retrieved from the internet Mar. 18, 2019: <URL: https://www.edn.com/design/analog/4442636/Trimming-a-digital-to-analog-converter-to-improve-accuracy->, (Sep. 1, 2016), 9 pgs.

\* cited by examiner

DIGITAL-TO-ANALOG CONVERTER TRANSFER FUNCTION MODIFICATION

FIELD OF THE DISCLOSURE

The present invention relates to an apparatus and method for digital-to-analog conversion. In particular, the disclosure relates to modification of the transfer function of digital-to-analog converters.

BACKGROUND

Digital-to-analog converters (DACs) convert digital input codes into analog output signals. DACs are widely used in a variety of applications, such as audio and video processing. One of the most common types of DACs is a string DAC. A string DAC includes a string of resistors, connected in series, between a voltage reference and ground. The resistor string acts as a potential divider, with different voltages being generated at each node along the string. These nodes are connected to an array of switches, which may be switched on and off to channel one of the voltages to an output. The switches are typically controlled by a decoder, which takes an input digital code, and determines which node to connect to the output, to generate a suitable analog voltage.

An important performance parameter of string DACs is accuracy, including linearity and non-linearity. Assuming all of the resistors are identical, and that other characteristics of the DAC are ideal, the relationship between the input code and the voltage output should be linear. However, owing to differences between the resistors values, voltage errors may appear at the nodes. In other words, for a particular input code, the voltage generated is slightly different to the ideal voltage.

SUMMARY OF THE DISCLOSURE

The present disclosure relates to a digital-to-analog converter (DAC) which includes a resistor string and a transfer function modification circuit. The transfer function modification circuit may be used to modify the transfer function to some desired transfer function. Alternatively, the transfer function modification circuit may be a calibration circuit for calibrating the DAC, for example to correct for non-linearities. The calibration circuit may include a plurality of current sources, which may be current DACs. Each of the current DACS inject current into, or drain current from, a respective node of the resistor string, in order to correct for voltage errors. The injected currents may be positive or negative, depending on the voltage error. The current DACs are controlled by trim codes, which are set dependent on the measured or simulated voltage errors for a given resistor string.

In a first aspect, the present disclosure provides a digital-to-analog converter (DAC), comprising: an impedance network, comprising a plurality of impedance elements coupled together via a plurality of nodes, wherein the impedance network is configured to be coupled to a reference voltage and to generate a plurality of voltage values at the plurality of nodes; and a transfer function modification circuit, configured to inject current into, or drain current from, two or more of the plurality of nodes of the impedance network, in order to modify the transfer function of the DAC; wherein the DAC is configured to select one or more nodes, from the plurality of nodes, to generate an analog output voltage.

In a second aspect, the present disclosure provides a method of modifying the transfer function of a digital-to-analog converter (DAC), comprising: determining a plurality of currents to inject into or drain from an impedance network of the DAC, in order to modify the transfer function of the DAC; injecting the currents into or draining the currents from respective nodes of the impedance string; and generating an analog output voltage, using the impedance network, wherein for a respective digital input code, the analog output voltage is modified by the injected or drained currents.

In a third aspect, the present disclosure provides a transfer function modification circuit for a digital-to-analog converter (DAC) having a impedance string having a plurality of impedance elements coupled in series, the calibration circuit, comprising: a plurality of current sources, each current source configured to inject current into a respective node of a plurality of nodes of the impedance string, in order to modify the transfer function of the DAC.

Further features of the disclosure are defined in the appended claims.

BRIEF DESCRIPTION OF THE DRAWINGS

The present disclosure will now be described, by way of example only, and with reference to the accompanying drawings, in which.

DETAILED DESCRIPTION

The present disclosure relates to calibration of the transfer function of a resistor string-based digital-to-analog converter (DAC). In one example, the disclosure relates to the correction of voltage errors in resistor string-based digital-to-analog converter (DAC). The resistor string includes a plurality of resistors connected in series between a voltage reference and ground. Voltages are generated at each node of the resistor string, and these are used to generate an analog output voltage. Owing to non-linearities in the DAC, voltage errors appear at the nodes. Non-linearities may be caused by various manufacturing variations, such as non-ideal resistor values, non-ideal switches, parasitic impedances and layout-dependent effects. Using measurements or simulation, it is possible to determine these errors.

The DAC also includes a calibration circuit for correcting the voltage errors. The calibration circuit includes multiple trim current DACs. The DACs act as current sources, which inject positive or negative currents into respective nodes. The number of DACs depends on the length of the resistor string, as well as other design constraints such as the availability of surface area on the semiconductor. Ideally, every node would have a corresponding trim current DAC, however this would typically be uneconomical. In the examples given below, for an eight resistor string, there are three trim current DACs. This provides a good balance between the effectiveness of the calibration techniques versus the requirements or targets, and the hardware requirements.

The amount of current injected into the nodes depends in the voltage errors, which may be measured or simulated. When a trim current DAC injects a current onto a node, it changes the voltage on all nodes. A transfer coefficient defines the relationship between a trim current DAC and the voltage on a particular node. A model determines the transfer coefficients for each DAC, before determining the required trim codes for a particular set of voltage errors. The present disclosure provides a calibration method that is simple to implement, and avoid interference with the signal path.

Figure 1:
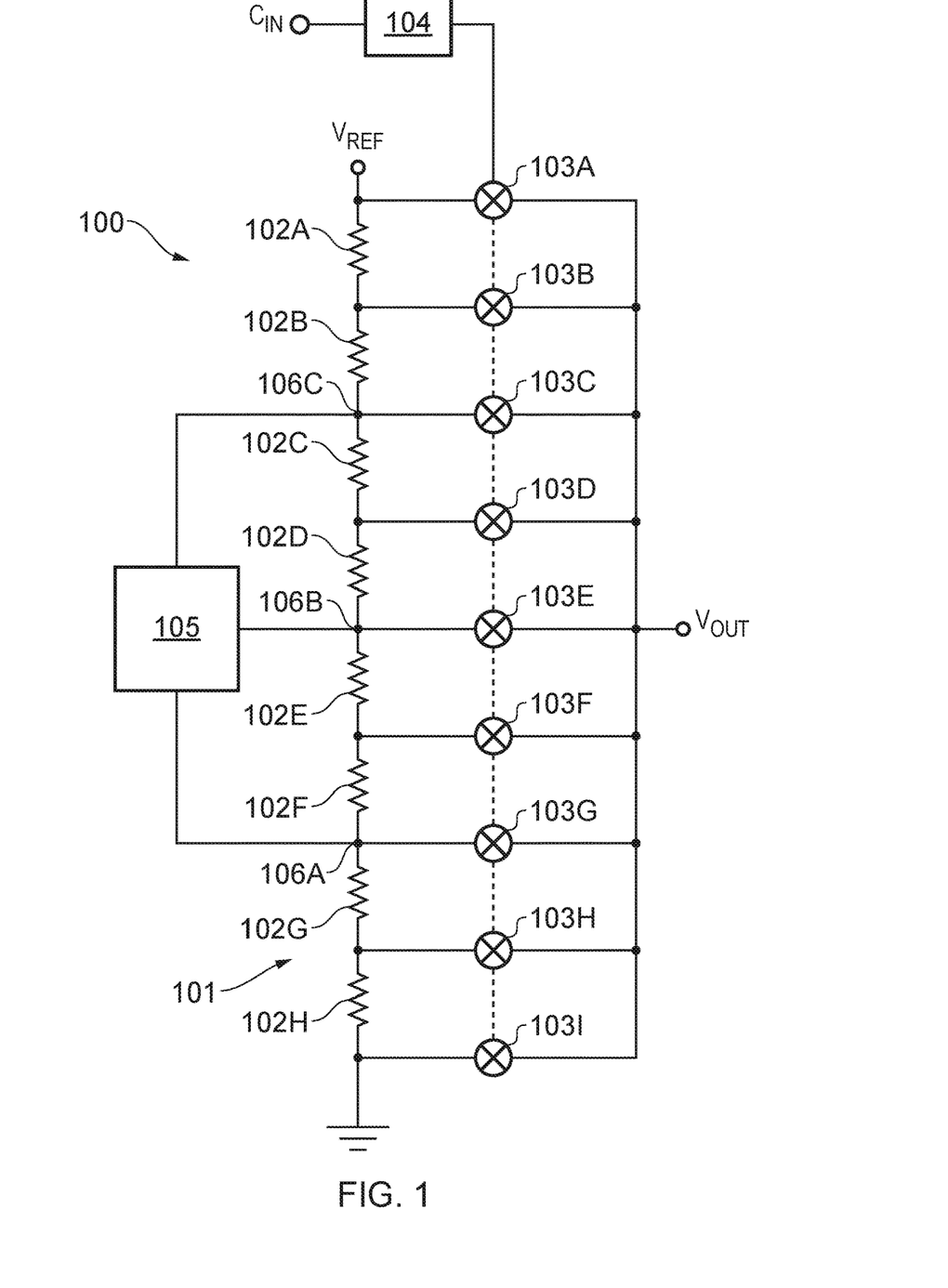
FIG. 1 shows a digital-to-analog converter (DAC) in accordance with an embodiment of the disclosure.

FIG. 1 shows a digital-to-analog converter (DAC) 100 in accordance with an embodiment of the disclosure. DAC 100 is a string DAC that includes a resistor string 101. In this example, the resistor string 101 includes a plurality of resistors. However, in alternative embodiments, the resistor string may be an impedance string comprising active devices such as field effect transistors (FETs). For the purposes of this disclosure, each embodiment will be described in the context of resistor strings, however, it will be appreciated that other types of impedance could be used in place of resistors. Furthermore, while the present embodiment is described in the context of a single-stage DAC, it will be appreciated that the disclosure may also be applied to multistage DACs, as well as multichannel multistage DACs. An example of a multichannel DAC is given in FIG. 9.

The resistor string 101 includes eight resistors 102A to 102H connected in series. One end of the resistor string 101 is connected to a voltage reference $V_{REF}$, and the other end is connected to ground. In an ideal case, each resistor takes the same value, and during operation the device operates in a linear manner. However, as will be discussed in more detail below, owing to manufacturing tolerances, the resistors 102A to 102H are not always identical, and systematic and random non-linearities may be introduced during manufacture.

The DAC 100 also includes a plurality of switches 103A to 103I. Each switch is connected to a node on the resistor string. At the ends of the resistor string 101, the switches are connected between the end resistors 102A and 102H, and $V_{REF}$ and ground respectively. The remaining switches are connected to nodes between two serially connected resistors. Each of the switches is then connected to an output $V_{OUT}$. The switches 103A to 103I are controlled by decoder 104. Decoder 104 is connected to a digital input which provides a digital code $D_{IN}$.

The resistor string 101 acts as a voltage divider with different voltages being generated at each node on the string. By connecting one of these nodes to $V_{OUT}$ using one of the switches 103A to 103I, an analog output voltage is generated. The decoder 104 determines which switch to switch on based on the digital code $D_{IN}$.

It is often a requirement of string DACs, such as string DAC 100, that there should be a linear relationship between the input code $D_{IN}$ and the analog output voltage $V_{OUT}$. In other words, the transfer function of the DAC should be linear. However, a real DAC introduces non-linearity, for example, owing to manufacturing tolerances. In a DAC, non-linearity may be introduced as differential non-linearity (DNL) and integral non-linearity (INL). The present disclosure provides a mechanism to improve DNL and INL. However, because it is possible to have good DNL and bad INL, but not good INL and bad DNL, the focus of this disclosure is on improving INL. In addition to the above, it may be desired to modify the transfer function of a DAC so that the relationship between the input code $D_{IN}$ and the analog output voltage $V_{OUT}$ is designed to be non-linear and follow a particular characteristic curve. The present disclosure provides an apparatus and method for modifying the transfer function of a DAC in order to correct INL, or to achieve a particular desired transfer function. It will be recognised that in both cases, the aim is to achieve or approximate a particular desired transfer function.

In a string DAC, INL manifests itself as voltage errors at one or more nodes of the resistor string 101. The voltage error is the difference between the desired voltage at a particular node, and the voltage achieved in a real circuit. As noted above, the desired voltage may be a voltage to achieve a linear transfer function, or may be some other voltage to achieve a desired transfer function.

The DAC 100 also includes a calibration circuit 105. Calibration circuit 105 is connected to a subset of the nodes of the resistor string 101. In this case, calibration circuit 105 is connected to nodes 106A, 106B and 106C. The calibration circuit 105 includes one or more current sources, which are used to inject current into the nodes 106A to 106C. The amount of current injected will depend on the measured voltage errors, and the desired transfer function. Because the voltage errors may be positive or negative, positive or negative current may be injected into nodes 106A to 106C. As such, the current source may be a source of current or may be a current sink. However, in this disclosure, the term "current source" is used to refer to a component which is able to source or sink current. By injecting appropriate amounts of positive or negative currents into the resistor string, the DAC 100 may be calibrated in order to provide a desired transfer function. As noted above, this may be a linear transfer function, or some other desired transfer function. In some examples, the DAC may be biased so that it is uni-directional, meaning current is only required to be sourced (or alternatively only sunk) from the calibration DACs. This may simplify the design of the calibration DACs.

In this disclosure, the calibration circuit 105 is connected to three nodes. The more nodes that are calibrated, the better the improvement to INL, or the better the accuracy of the achievable target transfer function. However, the more nodes that are calibrated, the more complicated the calibration circuit and the more hardware that is used. As such, there is a trade-off between the achievable INL and the amount of hardware used. In a real DAC, the number of resistors in the string equals $2^N$. For example, N may equal 5, in which case there would be 32 resistors. Alternatively, N may equal 10, in which case there would be 1024 resistors. As such, it may not be desirable or achievable to calibrate every single node. It will be appreciated that the number of calibrated nodes in this example is not intended to be limiting on the disclosure. More or less nodes may be calibrated depending on the requirements of a particular application. For example, the DAC may be user configurable to use only the number of calibration DACs required for a particular use case, making some calibration DACs redundant.

Figure 2:
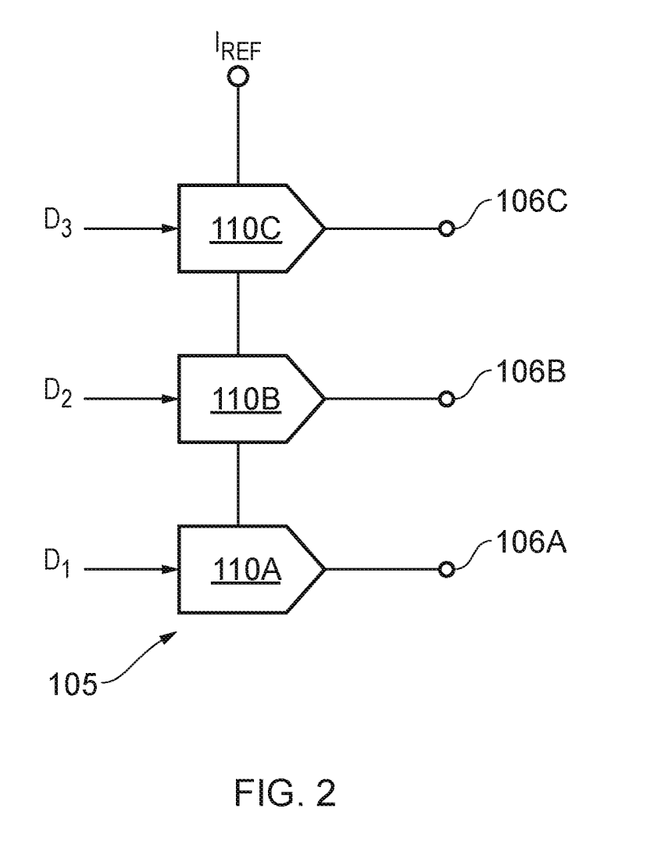
FIG. 2 shows a calibration circuit for use with the DAC of FIG. 1.

FIG. 2 shows the calibration circuit 105 in accordance with an embodiment of the disclosure. In this example, the calibration circuit 105 includes three trim current DACs 110A, 110E and 110C. An output of each trim current DAC is coupled to one of the respective nodes 106A to 106C. Each trim current DAC 110A to 110C receives a respective trim code $D_1$ to $D_3$. The trim current DACs 110A to 110C are provided with a reference current $I_{REF}$. Each trim current DAC acts as a current source which injects a positive or negative current into a respective node 106A to 106C. The currents generated by the trim current DACs depend on the reference current $I_{REF}$ and the trim codes $D_1$ to $D_3$. The currents supplied by the trim current DACs may be adjusted to adjust the transfer function of the DAC 100. In the case that the calibration circuit 105 is used to correct for INL, and therefore generate a linear transfer function, the voltage errors on the nodes 106A to 106C may be determined during manufacture, and the trim codes $D_1$ to $D_3$ may be pre-stored in memory. The same is true if the calibration circuit 105 is being used to achieve some other desired transfer function. As an alternative, the trim codes $D_1$ to $D_3$ may be stored in a look-up table (LUT) in which the values can be altered so that the transfer function can be modified in use. As a further alternative, the trim codes could be input code $D_{IN}$-dependent, such that the circuit is calibrated differently depending on the input code $D_{IN}$.

The following transfer matrix defines the relationship between the voltage errors at nodes 106A to 106C and the trim codes $D_1$ to $D_3$:

$$\begin{cases} C_{11} \cdot D_1 + C_{12} \cdot D_2 + C_{13} \cdot D_3 = E_1 \\ C_{21} \cdot D_1 + C_{22} \cdot D_2 + C_{23} \cdot D_3 = E_2 \\ C_{31} \cdot D_1 + C_{32} \cdot D_2 + C_{33} \cdot D_3 = E_3 \end{cases}$$

where $E_1$ is the voltage error at node 106A, $E_2$ is the voltage error at node 106B, and $E_3$ is the voltage error at node 106C. Trim current DAC 110 is DAC1, trim current DAC 110B is DAC2, and trim current DAC 110C is DAC3. $C_{ij}$ is the transfer coefficient defining the relationship between an input code on a particular DAC and the voltage change on a particular node where i is the node and j is the DAC. When a current is injected into a node, as well as the voltage on that node changing, the voltage on other nodes in the same string also change. As such, each trim code has a relationship with the voltage on each of nodes 106A to 106C, which is defined by the transfer coefficient. For example, $C_{21}$ means the voltage change at node 106B is caused by trim current DAC 110A. Based on particular voltage errors, the matrix can be solved to obtain the trim codes $D_1$ to $D_3$. Prior to doing this, the transfer coefficients must be established.

Figure 3:
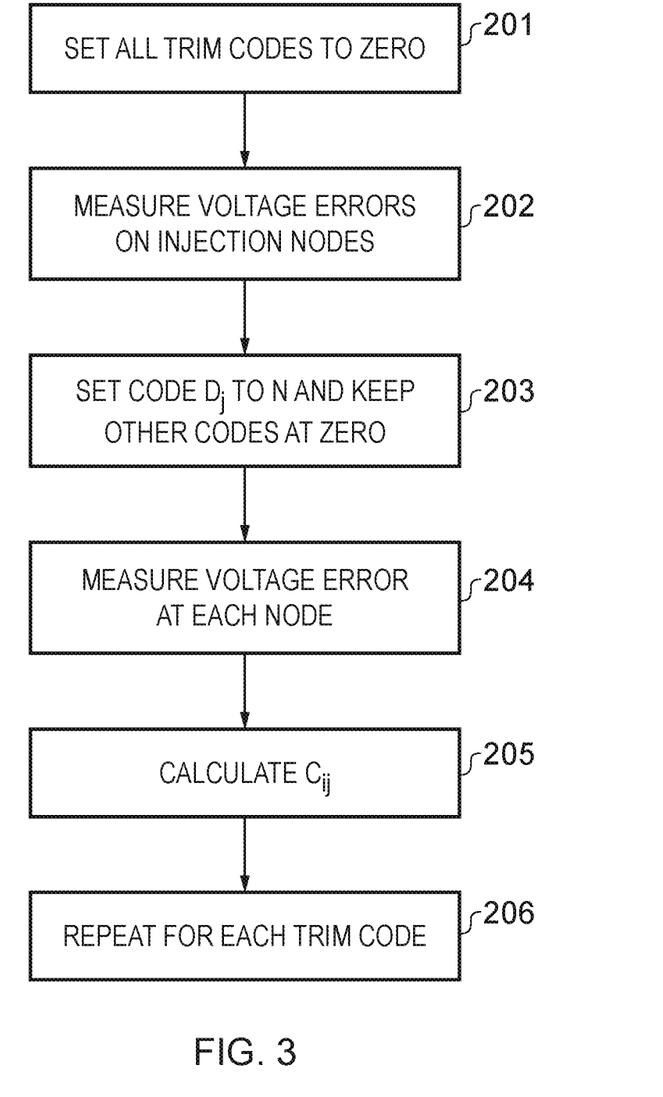
FIG. 3 is a flow chart showing a method of calculating transfer coefficients in accordance with an embodiment of the disclosure.

The process of determining the transfer coefficients is shown in FIG. 3. To do this, all of the trim codes are set to 0 (step 201) so that the trim current DACs do not contribute to the voltages at nodes 106A to 106C. The voltage at each node is then recorded (step 202) as $V_{NODE\_0,i}$. As such, when the code is set to 0, three voltages Vnode_0,1, Vnode_0,2 and Vnode_0,3 are determined. As an alternative, the trim codes could be set to midscale values, or some other nominal value. Furthermore, the trim codes could use a two's complement numbering system.

As a next step, the code for one of the trim current DACs is set to a particular value N, while the remaining trim codes are kept as 0 (step 203). N may equal 1. However, a larger value of N may be used to minimize errors resulting from non-linearity in the calibration DAC and read errors in the measurement. In this example, trim code $D_1$ is set to 5. The voltages at each node are then measured again and recorded as V_nodej,i. In this case, there will be three values corresponding to each node.

Each of the three transfer coefficients can then be calculated using the following equation:

$$C_{ij} = (Vnodej,i - Vnode\_0,i)/N$$

As such, for each node, by subtracting the voltage when the trim codes are 0 at that particular node from the voltage when a trim code is applied to a particular DAC, the contribution of that DAC to that node can be determined. The process is then repeated for each trim code (step 206). The transfer coefficients can then be put into the transfer matrix, and the trim codes may then be determined, based on the voltage errors. The trim codes may then be stored in memory, so that they are maintained when the device is powered off. In one embodiment, the trim codes, and hence calibration of the transfer function, remains constant. In an alternative embodiment, a LUT may be used, meaning that different trim codes may be selected at different times, or in response to different inputs.

In order to optimise the corrected target voltages, optimisation algorithms such as least mean squares (LMS) may be used. Other optimisation algorithms and design strategies may be used as will be appreciated by the person skilled in the art.

As noted above, the more trim DACs provided, the better the degree of achievable calibration. Additionally, higher trim DAC resolution also improves achievable calibration.

In the above examples, the determination of the calibration coefficients has been explained for the benefit of the reader. It will be appreciated that in practical applications, they would be determined in simulation.

Figure 4:
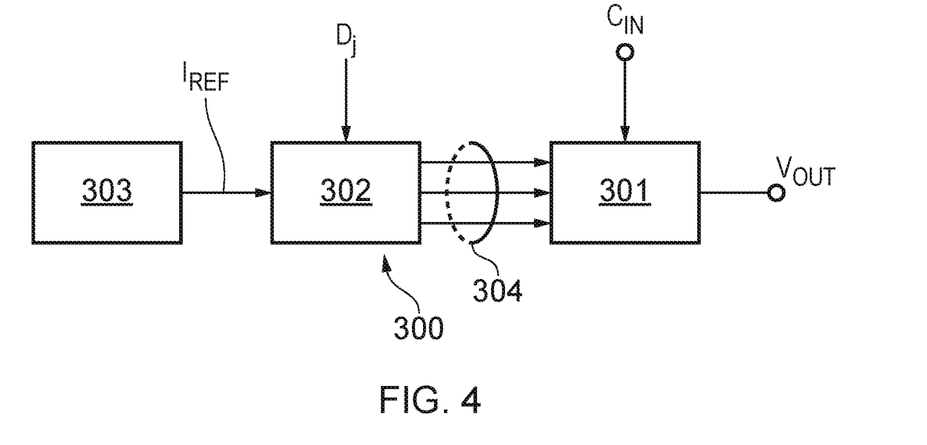
FIG. 4 shows a DAC in accordance with a further embodiment of the disclosure.

FIG. 4 shows a DAC 300 in accordance with a further embodiment. In this example, some of the details of the DAC elements are omitted for clarity. DAC 300 includes primary DAC components 301. The primary DAC components include a resistor string, switches and a decoder. The primary DAC components 301 receive the input code $D_{IN}$ and output an analog voltage $V_{OUT}$. The DAC 300 also includes a calibration circuit 302. The calibration circuit 302 may include a plurality of current sources, each configured to supply trim currents 304 to the primary DAC components 301. The calibration circuit 302 also receives trim codes $D_1$, which may be determined in the manner described above in connection with FIG. 3. The calibration circuit 302 also receives a reference current $I_{REF}$ which is generated by reference current generator 303.

Figure 5:
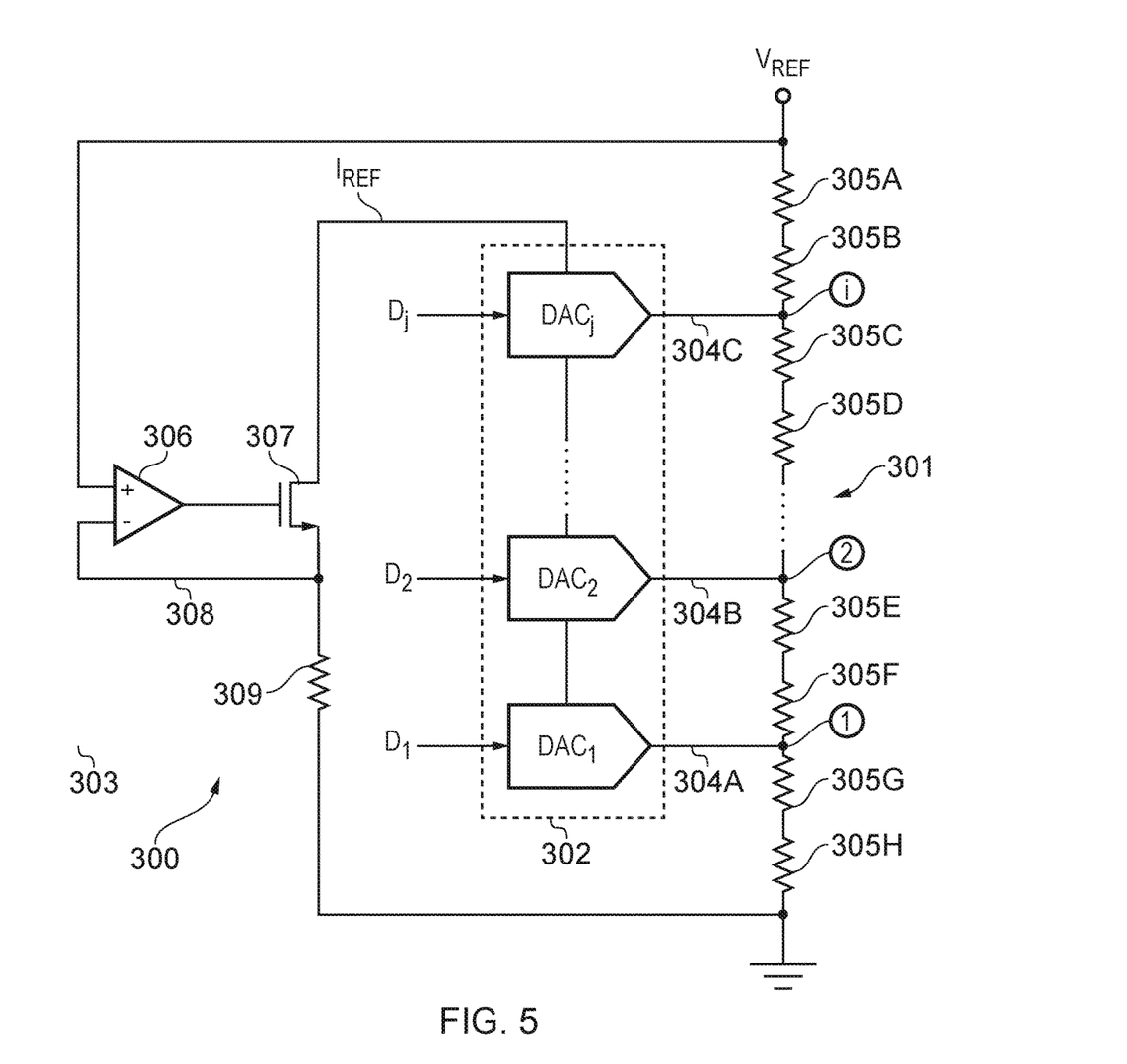
FIG. 5 shows a DAC in accordance with a further embodiment of the disclosure.

FIG. 5 shows DAC 300 in further detail. The primary DAC components 301 include a resistor string 305, which includes serially connected resistors 305A to 305H. One end of the resistor string is coupled to ground, and the other to $V_{REF}$. The other components of the DAC, such as those shown in FIG. 1, have been omitted for clarity. The resistor string includes more resistors that shown in FIG. 5, as indicated by the ellipsis. In one example, the DAC may have several hundred resistors. The calibration circuit 302 includes trim current $DAC_1$, trim current DAC2 and trim current DAC3. Again, there may be more trim current DACs, depending on the number of resistors, and the required level of calibration. Each trim current DAC supplies a trim current 304 to a respective node 1, 2 or i. The trim current DACs are each supplied with the reference current $I_{REF}$ and trim codes $D_1$, $D_2$ and $D_j$. In this example, the trim DACs may be 7-bit current DACs, in which the MSB is the sign bit.

The number of calibration DACs provided for a given resistor string is a design consideration for a particular arrangement. Typically, the resistor string is designed and implemented in accordance with best practice to achieve sufficient accuracy and performance for a particular application. The number of calibration DACs required to calibrate the transfer function depends on the level of flexibility required in a particular application or use case. If the purpose of calibration is to correct for non-linearity, the design may be optimized by considering resistor string parameters such as DAC area, mismatch, power, capacitance, speed, noise and complexity, and considering calibration DAC requirements such as area, power, speed, accuracy and complexity.

The reference current generator 303 may be a precision current source. In this example, the generator 303 uses an opamp 306, a FET 307 and a resistor 309 to generate a precision current based on $V_{REF}$. As such, the reference current is dependent on the reference voltage, and does not need to be adjusted to take into account different reference voltages. The opamp 306 is connected in negative feedback by feedback path 308. The high open loop gain of the opamp in the current source forces FET 307 'on' so $V_{REF}$ appears across the resistor, driving a current proportional to $V_{REF}$.

Figure 6:
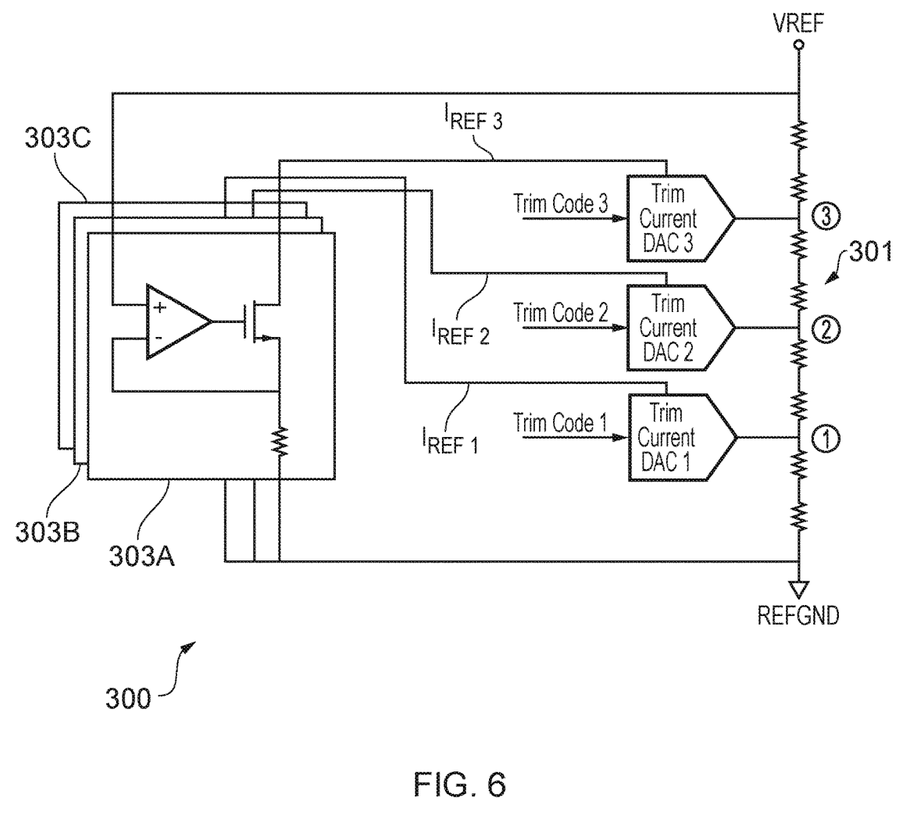
FIG. 6 shows a DAC in accordance with a further embodiment of the disclosure.

FIG. 6 shows an alternative embodiment to that shown in FIG. 5, in which each trim DAC includes its own reference current. In this embodiment, each DAC may be supplied with a different reference current. This may be achieved using multiple, parallel precision current sources. DAC 300 includes reference current generators 303A, 303B and 303C. The reference current generator supplies reference currents $I_{REF1}$, $I_{REF2}$, and $I_{REF3}$ respectively. This enables greater configurability when compared with a DAC having a single, common reference current. As an alternative to the above, one current generator could be used, with current mirrors or replicators arranged to copy the same current for each DAC.

Figure 7:
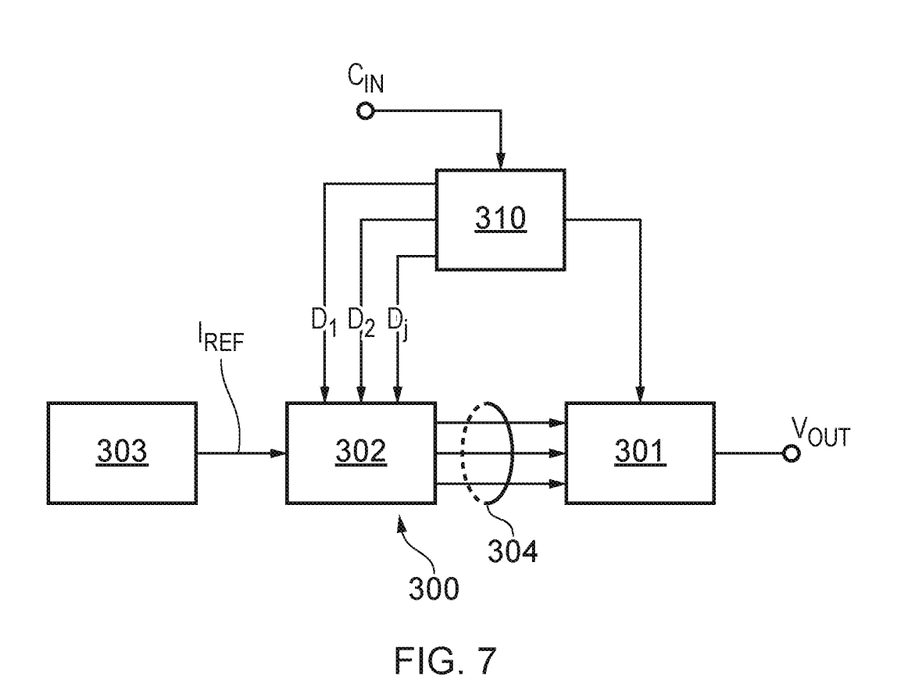
FIG. 7 shows a DAC in accordance with a further embodiment of the disclosure.

FIG. 7 shows DAC 300 in accordance with a further embodiment. In FIG. 7, components that are common with FIGS. 4 and 5 are shown with the same reference numerals and are not described here again. In this example, the trim codes $D_1$, $D_2$ and $D_j$ form part of the input path. The DAC 300 includes a decoder 310. The decoder 310 receives an input code $D_{IN}$, and determines which node of the resistor string to couple to $V_{OUT}$. In addition, in this example, the decoder is also configured to determine the trim codes. As such, the trim codes may be tweaked to adjust the DAC output. This provides better output resolution that would be possible without the trim current DACs. In one example, the decoder may ordinarily provide trim codes that are determined as described above in accordance with FIG. 3. However, where additional resolution is required, they may also be used to fine tune the DAC output.

In an alternative example, different trim codes could be applied to the resistor string for the same input code. In other words, the trim codes could be used to produce different outputs for a given input.

In the case of a multistage DAC, the resistor string is loaded by the sub DACs. The sub DAC load may be negligible. For example, it may have high input impedance, be voltage buffered or a buffered by a Norton equivalent current source. Alternatively, the load may be significant. If the sub DAC load is significant, digital processing may modify the data codes input to the trim DACs and/or the signal path DACs to account for such loading.

Figure 8:
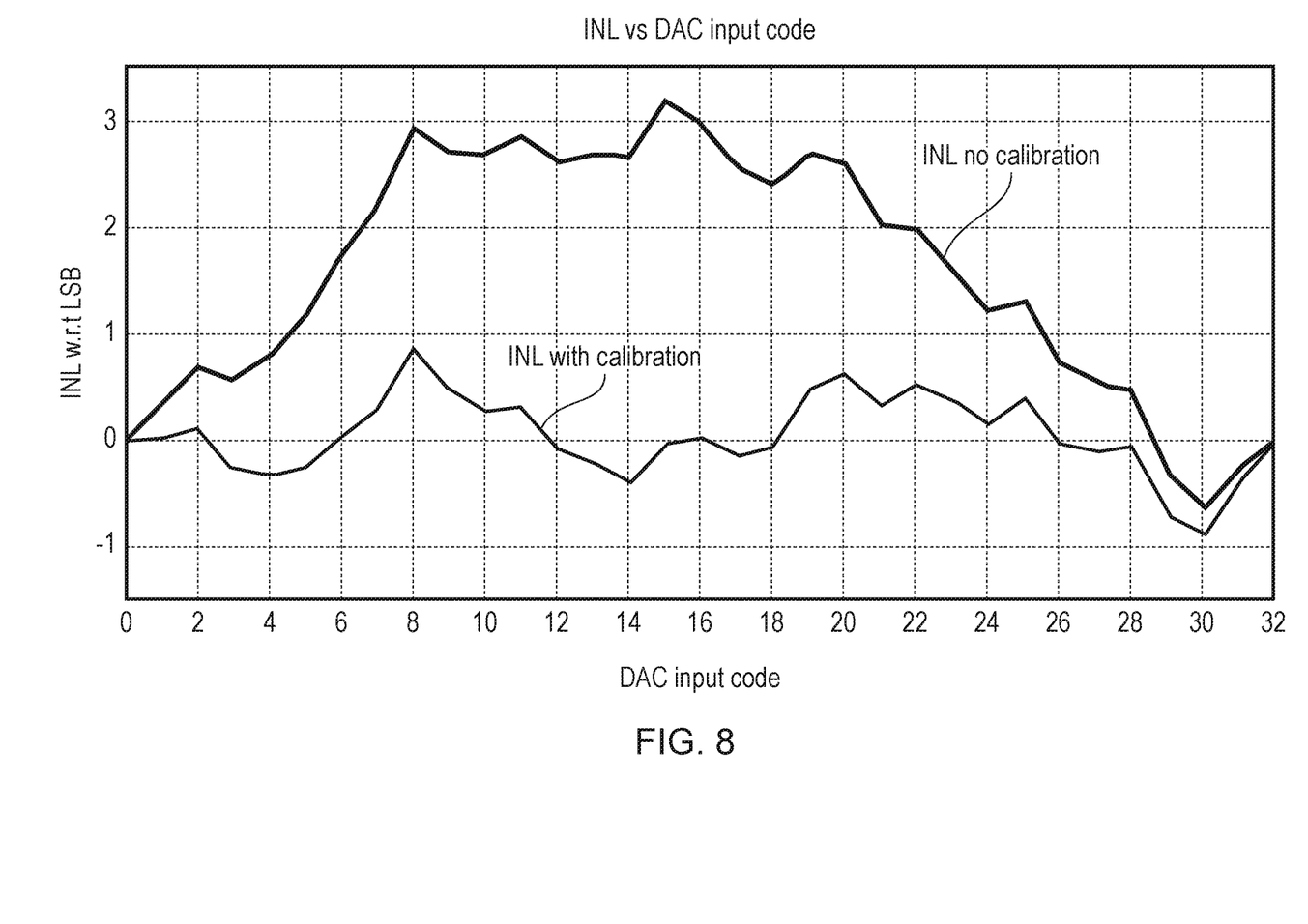
FIG. 8 is a chart showing INL versus DAC input code.

FIG. 8 is a chart showing how INL is improved by an embodiment of the present disclosure. The x-axis is the input code, and the y-axis is a measure of INL relative to the least significant bit (LSB). As can be seen, without any calibration, INL peaks at 3.2 LSB. With calibration, INL error peaks are reduced to 0.8 LSBs, and is generally flat relative to the uncalibrated plot, which is a desirable quality indicating low DNL error.

Figure 9:
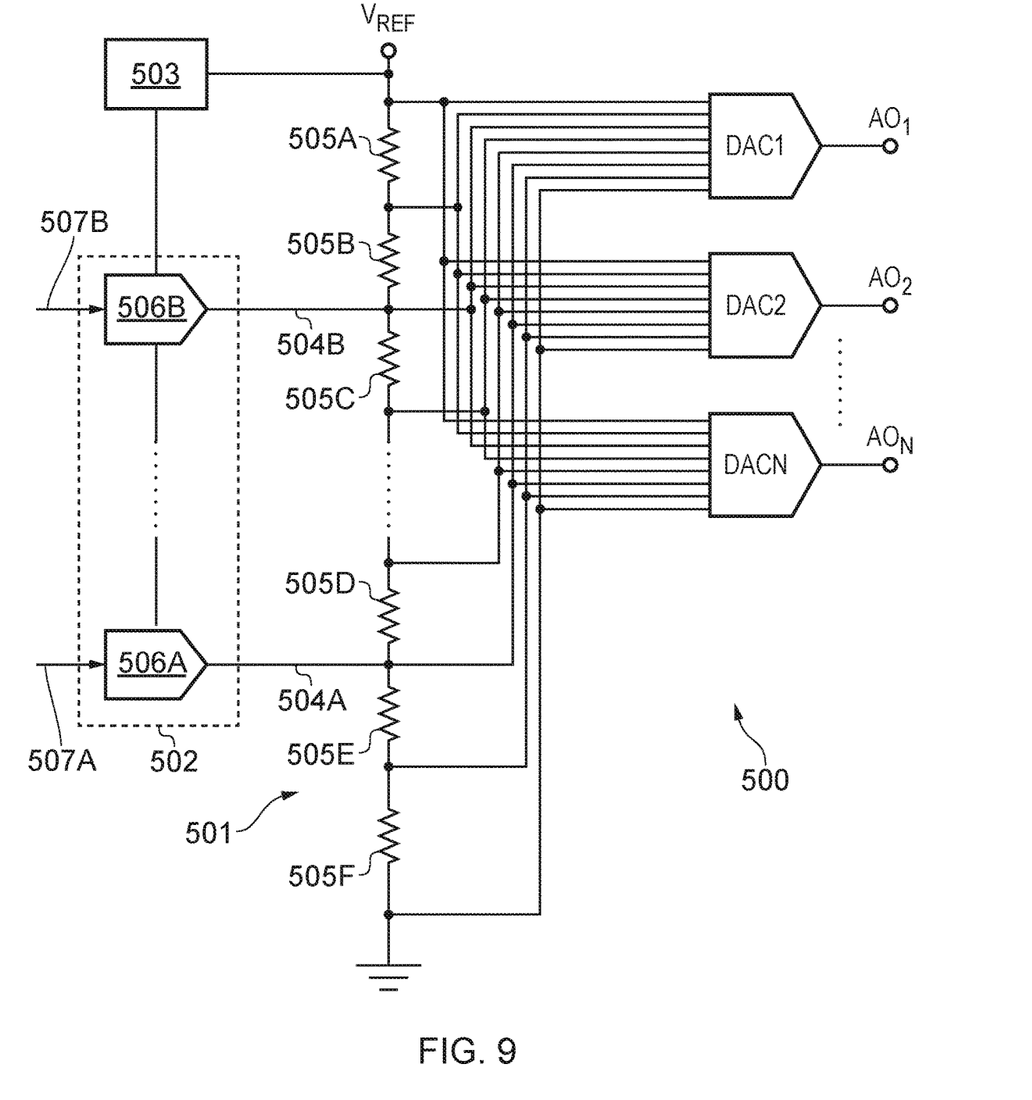
FIG. 9 shows a DAC in accordance with a further embodiment of the disclosure.

FIG. 9 show a multichannel DAC 500 in accordance with an embodiment of the disclosure. As noted above, the present disclosure may be applied to multistage and multichannel DACs, as well as the single-string DAC shown in FIG. 5. The multichannel DAC 500 includes a resistor sting 501 and a calibration circuit 502. The calibration circuit 502 is provided with a reference current by current source 503. The calibration circuit 502 provides calibration signals 504A and 506B to the resistor string 501. In this example, two calibration signals are provided. However, as with previous examples, a greater number of calibration signals may be provided. The resistor string includes a plurality of resistors 505A to 505F coupled in series. Whereas in the previous examples, the nodes of the resistor string were coupled directed to an output by the decoder and a series of switches, in this example each node is connected to an input of additional DAC1, DAC2 and DACN. Each DAC represents a channel of the multichannel DAC. The DAC outputs are coupled to analog outputs $AO_1$, $AO_2$ and $AO_N$. The calibration circuit includes trim DACs 506a and 506B. Each trim DAC is coupled to respective node of the resistor string, and is provided with trim codes 507A and 507B.

The calibration circuit 502 operates in the same manner as that described above in connection with the single-string DAC examples. An advantage of using this technique with a multichannel DAC is that when the first string is calibrated, the entire DAC, including the DACs of each channel, is calibrated. The sub-DAC(s) design may be optimized using best practice to provide sufficient accuracy without sub-DAC nonlinearity calibration. The design flow presented focusses around calibrating the first string (primary or MSB DAC DAC) transfer function. It does not tackle or try to do anything to the transfer function of the sub-DACs sharing this first string. For the most regular, linear target case, the sub-DACs sharing this first string will be designed using circuit and layout design best practice to achieve the required linearity performance without needing any further calibration to maximize performance and also reducing digital power consumption. The user may also use digital calibration of the sub-DAC(s) to change their transfer function digitally, if needs be.

Figure 10:
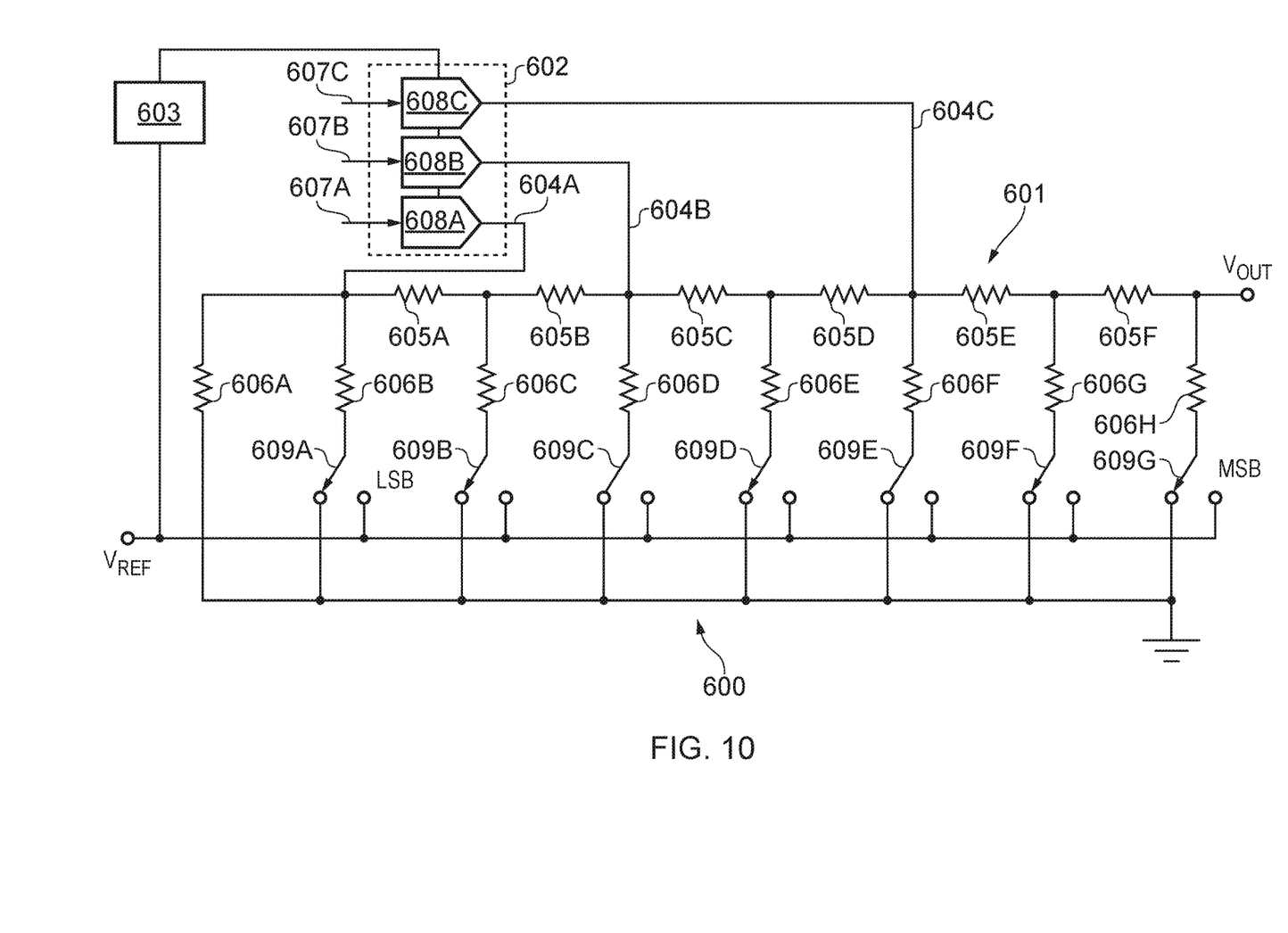
FIG. 10 shows a DAC in accordance with a further embodiment of the disclosure.

FIG. 10 shows an R-2R DAC 600 in accordance with an embodiment of the disclosure. The present disclosure may also be applied to DACs having other types of resistor networks, such as ladder DACs, and specifically R-2R DACs. The R-2R DAC 600 includes a resistor network 601 and a calibration circuit 602. The calibration circuit 602 is provided with a reference current by current source 603. The calibration circuit 602 provides calibration signals 604A, 604B and 604C to the resistor network 601. In this example, two calibration signals are provided. However, as with previous examples, a greater number of calibration signals may be provided. The resistor network 601 includes a plurality of series connected resistors 605A to 605F. Furthermore, the resistor network 601 includes a plurality of parallel connected resistors 606A to 606H. As such, the resistor network forms an R-2R network. The parallel connected resistors are coupled to a plurality of switches 609A to 609G, which are controlled by a decoder (not shown). The calibration circuit includes trim DACs 608A, 608B and 608C. Each trim DAC is coupled to respective node of the resistor network, and is provided with trim codes 607A, 607B and 607C. The calibration circuit 602 operates in the same manner as that described above in connection with the single-string DAC examples. It should be noted that, as an alternative, unary weighted, binary and non-binary (e.g. sub-radix two) networks may be used.

Figure 11:
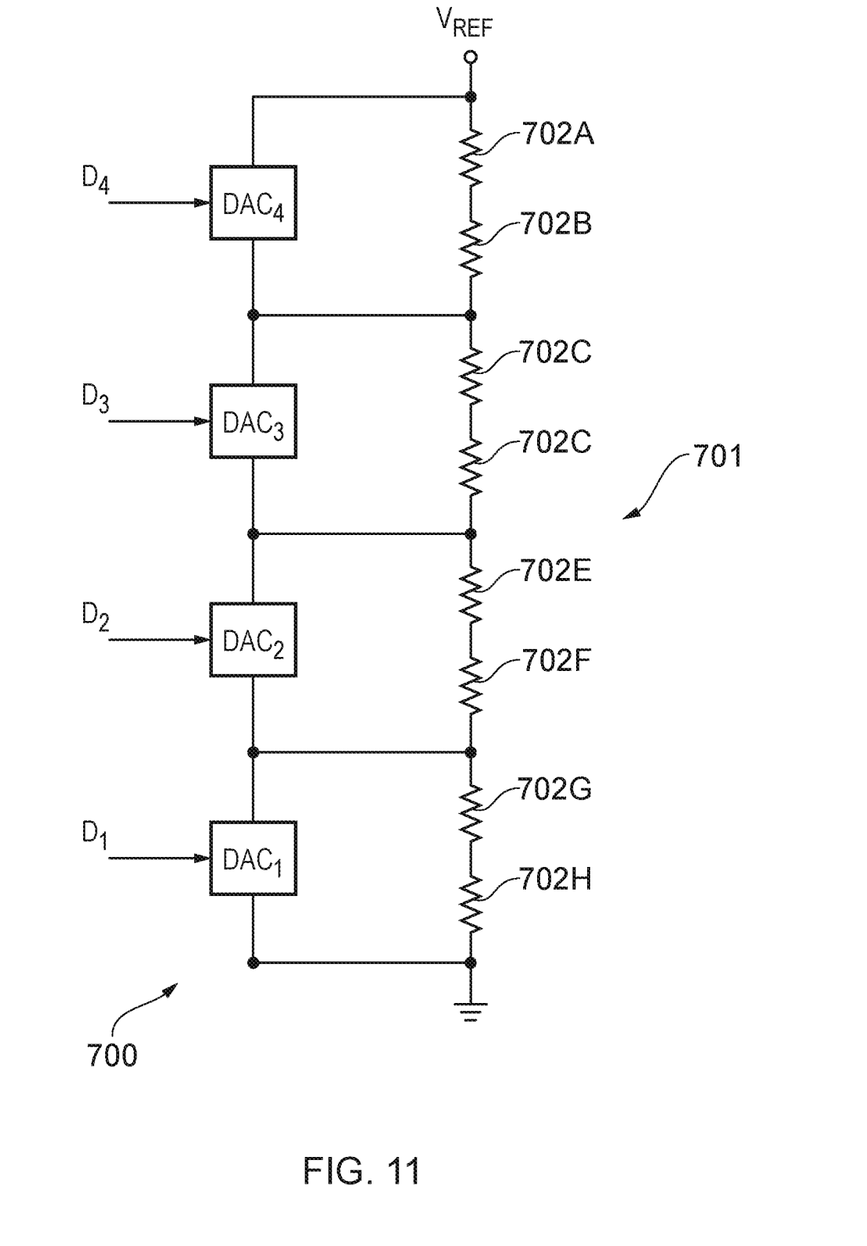
FIG. 11 shows a DAC in accordance with a further embodiment of the disclosure.

FIG. 11 shows a DAC 700 in accordance with a further embodiment. In the above disclosure, the trim DACs are current DACs. Current DACs are good for this application, because they have high impedance outputs, which is better for the resistor string. However, in this embodiment, impedance devices such as resistive DACs are used. The DAC 700 includes a resistor string 701 which includes resistors 702A to 702H, connected in series. The DAC 700 also includes four resistive trim DACs, which are trim $DAC_1$, trim $DAC_2$, trim $DAC_3$, and $DAC_4$. Each DAC is trimmable using trim codes $D_1$, $D_2$, $D_3$, and $D_4$. Each trim DAC is connected across a pair of resistors in the resistor string. Being resistive DACs, the trim DACs take their voltage reference directly from the $V_{REF}$. The trim DACs may be basic resistor networks, but could also use FETs as the impedance device.

Current DACs have a high impedance output and may be more appropriate when making minor calibration changes to the transfer function of the DAC. However, when making larger scale changes to the DAC transfer function, resistive networks which have low impedance outputs may be more appropriate.

As a further alternative, digitally controlled resistors may be used in place of the trim DACs. Digitally variable resistors are provided in two primary options. Firstly, they may be configured as two terminal digitally variable resistors or digital rheostats. Secondly, they may be configured as digitally variable resistors with a third divider terminal. These are referred to as digital potentiometers or digiPOTs for short. U.S. Pat. No. 9,583,241 B1 (which is hereby incorporated by reference) is an example of a digiPOT which may be utilised in conjunction with the present disclosure.

In addition to the string DAC and R-2R DAC examples given above, the present disclosure may be applied to DACs having other types of resistor networks and resistor ladders. For example, the present disclosure may also be applied to R-3R DACS and segmented DACs.

In an alternative embodiment, the DAC may be recalibrated based on temperature. For example, the system may have a tolerance of plus/minus 5 degrees. If the system operates outside of this range, the device could be recalibrated.

The calibration circuit current sources, as described above, may have positive or negative output current polarity. In the art, the term current sink is used to describe current sources with negative output current. However, in this description the more general term current source is used to describe a current source device or element.

In the above-described examples, the trim codes are generally input code independent. One set of trim codes is used, regardless of the input code. In another example, the trim codes may be input code dependent.

The above embodiments have been described in the context of a single-ended single-reference DAC. It will be appreciated that the disclosure may be implemented in a differential arrangement which may include upper and lower DAC references.

In the above embodiments, it is noted that, for resistive trimmable DACs, the DACs may be passive or active. For active devices, as well as FETs, other types of switches such as MEMs, NEMs, dual-gate, finFETs, GAA FETs and MOS technology may be used.

In one example embodiment, the present disclosure is implemented as an integrated circuit.

The present disclosure may be used in any number of applications. For example, the disclosure may be used in DACs in automotive, industrial, instrumentation, communications, optical networks and healthcare applications. Furthermore, such a DAC may be used in sensors and actuators, including non-electrical sensors such as chemical sensors and biosensors. Furthermore, any application where linearity is important, or where adaptability of the transfer function is desirable, may find use for the DACs of this disclosure.

The invention claimed is:

1. A digital-to-analog converter (DAC), comprising:
    an impedance network, comprising a plurality of impedance elements coupled together via a plurality of nodes, wherein the impedance network is configured to be coupled to a reference voltage and to generate a plurality of voltage values at the plurality of nodes; and
    a transfer function modification circuit, configured to inject current into, or drain current from, two or more of the plurality of nodes of the impedance network, in order to modify the transfer function of the DAC to calibrate the transfer function based on a target transfer function; wherein
    the DAC is configured to select one or more nodes, from the plurality of nodes, to generate an analog output voltage.

2. A DAC according to claim 1, wherein the values of the injected or drained currents are based on the voltage errors at the respective nodes.

3. A DAC according to claim 2, wherein the voltage errors are integral non-linearity (INL) errors.

4. A DAC according to claim 1, wherein the target transfer function is substantially linear relationship between the digital input codes and the analog output voltage.

5. A DAC according to claim 1, wherein the transfer function modification circuit comprises a plurality of trimmable DACs, an output of each trimmable DAC coupled to a node of the plurality of nodes.

6. A DAC according to claim 1, wherein the transfer function modification circuit comprises a plurality of current sources, each current source coupled to a node of the plurality of nodes, and each current source configured to inject current into or drain current from a respective node.

7. A DAC according to claim 6, wherein the current sources are calibration DACs, and the output of each calibration DAC is coupled to the respective node of the impedance network.

8. A DAC according to claim 7, wherein the calibration DACs are current DACs and the current DACs are each configured to receive a trim code, wherein the trim code is based on the voltage errors at the respective nodes.

9. A DAC according to claim 1, further comprising a reference current source, configured to supply transfer function modification circuit with a reference current.

10. A DAC according to claim 1, wherein the transfer function modification circuit comprises a plurality of resistive DACs, each DAC arranged to generate a voltage at a respective one of the plurality of nodes.

11. A DAC according to claim 1, further comprising a switch network, coupled to the plurality of nodes, and configured to select one or more voltage values based on a digital input code to generate an analog output voltage.

12. A DAC according to claim 1, wherein the impedance network includes at least one resistor string and the resistors are connected in series.

13. A method of modifying the transfer function of a digital-to-analog converter (DAC), comprising:
   determining a plurality of currents to inject into or drain from an impedance network of the DAC, in order to modify the transfer function of the DAC to calibrate the transfer function based on a target transfer function;
   injecting the currents into or draining the currents from respective nodes of the impedance string; and
   generating an analog output voltage, using the impedance network, wherein for a respective digital input code, the analog output voltage is modified by the injected or drained currents.

14. A method according to claim 13, further comprising:
   determining voltage errors at the respective nodes; and
   wherein the plurality of currents are determined based on the respective voltage errors.

15. A method according to claim 14, wherein the currents are injected or drained by current DACs, and the injected currents are determined by trim codes of the current DACs.

16. A method according to claim 13, wherein the current injected by each current DAC contributes to the voltage at each node, wherein the trim codes are selected such that the overall contribution to the voltage at a given node substantially cancels the voltage error.

17. A method according to claim 16, wherein the relationship between a trim code for a respective current DAC, and the voltage on particular node is given the transfer function $C_{ij}$, where i is the node and j is the current DAC.

18. A method according to claim 17, wherein the transfer function depends on the DAC input code.

19. A transfer function modification circuit for a digital-to-analog converter (DAC) having a impedance string having a plurality of impedance elements coupled in series, the circuit comprising:
   a plurality of current sources, each current source configured to inject current into a respective node of a plurality of nodes of the impedance string, in order to modify a transfer function of the DAC to calibrate the transfer function based on a target transfer function.

20. The circuit of claim 19, in which the plurality of current sources includes each current source configured to inject current into a respective node of a plurality of nodes of the impedance string, in order to modify a transfer function of the DAC toward the target transfer function.

21. The circuit of claim 19, in which the plurality of current sources includes each current source configured to inject current into a respective node of a plurality of nodes of the impedance string, in order to modify a transfer function of the DAC to obtain the target transfer function.

22. A DAC according to claim 19, wherein the transfer function modification circuit comprises a plurality of current sources, each current source coupled to a node of the plurality of nodes, and each current source configured to inject current into or drain current from a respective node.

23. A DAC according to claim 22, wherein the current sources are calibration DACs, and the output of each calibration DAC is coupled to the respective node of the impedance network.

* * * * *